(12) United States Patent
Lee

(10) Patent No.: US 6,732,295 B2
(45) Date of Patent: May 4, 2004

(54) METHOD AND SYSTEM OF FREQUENCY MODULATED END-POINT DETECTION

(75) Inventor: Szetsen Steven Lee, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 565 days.

(21) Appl. No.: 09/747,210

(22) Filed: Dec. 22, 2000

(65) Prior Publication Data

US 2001/0007778 A1 Jul. 12, 2001

(30) Foreign Application Priority Data

Dec. 29, 1999 (TW) ........................................ 88123190 A

(51) Int. Cl.$^7$ ............................. G06F 11/00; G11B 5/00
(52) U.S. Cl. ............................................ 714/27; 700/177
(58) Field of Search ................................. 714/27, 25, 37, 714/39, 47, 45, 46; 700/177, 39, 194, 173

(56) References Cited

U.S. PATENT DOCUMENTS

| | | | | | |
|---|---|---|---|---|---|
| 5,467,883 A | * | 11/1995 | Frye et al. | ..................... | 216/60 |
| 5,474,648 A | * | 12/1995 | Patrick et al. | ................ | 438/10 |
| 5,658,423 A | * | 8/1997 | Angell et al. | .................. | 438/9 |
| 6,529,794 B1 | * | 3/2003 | Storck et al. | ............... | 700/177 |

* cited by examiner

*Primary Examiner*—Nadeem Iqbal
(74) *Attorney, Agent, or Firm*—Ladas & Parry

(57) ABSTRACT

The present invention provides a method of frequency modulated end-point detection. Control signals are sent to the manufacture device for performing the manufacturing process, wherein process signals are generated along with the manufacturing process. Process signals are filtered to obtain synchronization signals synchronized with the control signals. A judging standard is provided according to the synchronization signals corresponding to a specific state of the process. The synchronization signals are continuously monitored, and a process end-point is determined when the synchronization signals do not meet the judging standard.

16 Claims, 3 Drawing Sheets

METHOD AND SYSTEM OF FREQUENCY MODULATED END-POINT DETECTION

BACKGROUND OF THE INVENTION

1. Field of the Invention

The present invention generally relates to an end-point detecting method and the related manufacturing apparatus. More specifically, the present invention relates to a method using frequency modulation to determine the end-point of the manufacturing process and the related manufacturing apparatus.

2. Description of the Related Art

In the semiconductor manufacturing process, the end-point method is used to control the manufacturing time, which influences the quality of the product. FIG. 1 is a conventional manufacturing apparatus. The manufacturing apparatus 10 comprises a manufacturing device 12, a control device 14 and an end-point detecting device 16. The desired manufacturing process is performed in the manufacturing device 12 and a process signal PS is provided. The control device 12 provides the control signal CS controlling the power supply needed by the manufacturing device 12 and the enabling mechanism of the manufacturing device 12. During the manufacturing process, the end-point detecting device 16 monitors the manufacturing signal and determines whether the manufacturing device 12 is operating within predetermined conditions. An end-point is determined when the end-point detecting device 16 detects the manufacturing device 12 is operating outside the predetermined conditions. At this time, the end-point detecting device 16 informs the control device 14 to carry out a reaction to stop the manufacturing process or change the manufacturing parameter to begin the next manufacturing step.

For the purpose of illustration, assume the manufacturing apparatus 10 is a plasma etching system, the manufacturing device 12 could be a vacuum chamber, the control device 14 could be a power supply for providing a RF plasma power source or a general power supply to the vacuum chamber. In this case, the end-point detecting device 166 detects the light intensity signal generated by discharge of electrons of the plasma in the vacuum chamber and determines the plasma etching state in the vacuum chamber.

Generally, the end-point detecting method is used only after the manufacturing process has continued for a predetermined time and a stable state has been obtained. Thus, the misjudgment of the end-point caused by the unstable state of at the beginning of the manufacturing process can be avoided.

Most conventional end-point detecting methods simply monitor the process signal PS generated by the manufacturing device 12. One end-point detecting method averages the process signals collected over a time period after the procedure is started as the standard average value. The standard average value is compared to the current process signal PS to determine whether an end-point is reached. Referring to FIG. 2, the process signals PS from 0 to time $T_a$ are averaged to obtain a standard average value $I_a$. If the current process signal is less than $0.9I_a$, an end-point is detected.

However, accidental noises might affect the state of the manufacturing device 12. For example, a bad ground connection or aged components in the control device 14 might cause the power supply to the manufacturing device 12 to have a sudden power surge. The end-point detecting device 16 could incorrectly take the instance of the power surge as the end-point and mistakenly stop the manufacturing process.

A time-average method can be used to overcome the problem of an unstable end-point. For the best time-average result, a long period is used to do signal averaging. In other words, the sudden noise is "diluted" by a long period, so that the judgement of the end-point won't be affect. However, in real processes, this is impractical, as the manufacturing process will be delayed.

SUMMARY OF THE INVENTION

Therefore, an object of the present invention is to provide an end-point detecting method using frequency modulation to accurately find the end-point of the manufacturing process in a manufacturing device.

The present invention provides a method of frequency modulated end-point detection. First, control signals are sent to the manufacture device for performing the manufacturing process, wherein process signals are generated along with the manufacturing process. Then, the process signals are filtered to obtain synchronization signals synchronized with the control signals. Then, a judging standard is provided according to the synchronization signals corresponding to a specific state of the process. Finally, the synchronization signals are continuously monitored, and a process end-point is determined when the synchronization signals do not meet the judging standard.

The present invention further provides a manufacturing system with method of frequency modulated end-point detection. The manufacturing system has a control device, a manufacturing device and an end-point detecting device. The control device provides control signals. The manufacturing device performs a manufacturing process controlled by the control signals and generates process signals. The end-point detecting device monitors and filters the process signals to generate synchronization signals synchronized with the control signals. Furthermore, the end-point detecting device determines an end-point according to a judging standard defining the value of the synchronization signals corresponding to a specific state of the process.

The advantage of the present invention is the filtering of external noises. Because the external noises always have a different frequency than that of the control signals, the judging standard may eliminate the effect of the external noises and the end-point is thus found is accurately. Even though the control signals could be distorted slightly by the external noises, the effect can be countered by applying a simple computation of the ratio between the synchronization signal and the control signals.

BRIEF DESCRIPTION OF THE DRAWINGS

The drawings referred to herein will be understood as not: being drawn to scale except if specially noted, the emphasis instead being placed upon illustrating the principles of the present invention. In the accompanying drawings.

DETAILED DESCRIPTION OF THE PREFERRED EMBODIMENTS

Reference is now made in detail to an embodiment of the present invention that illustrates the best mode presently contemplated by the inventor(s) for practicing the present invention.

Figure 1:
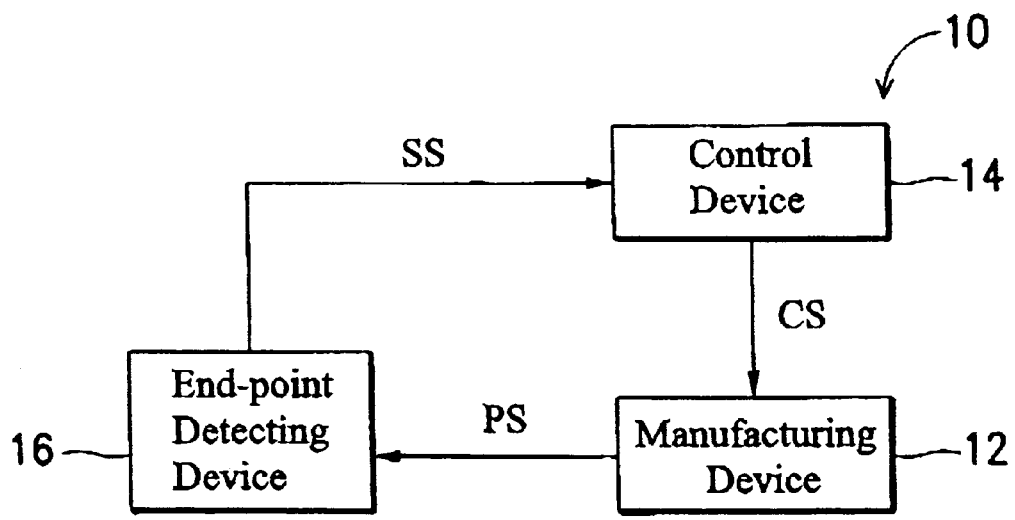
FIG. 1 represents a conventional manufacturing apparatus.
Figure 2:
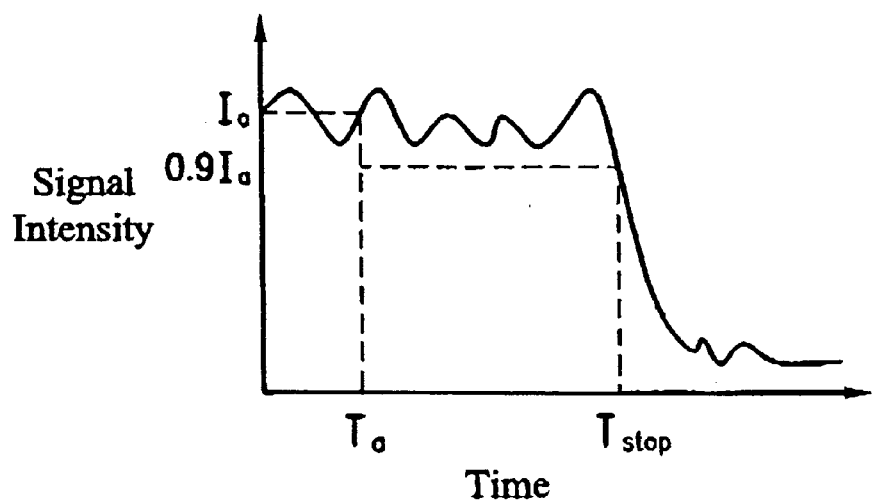
FIG. 2 represents a graph of signal intensity against time.
Figure 3:
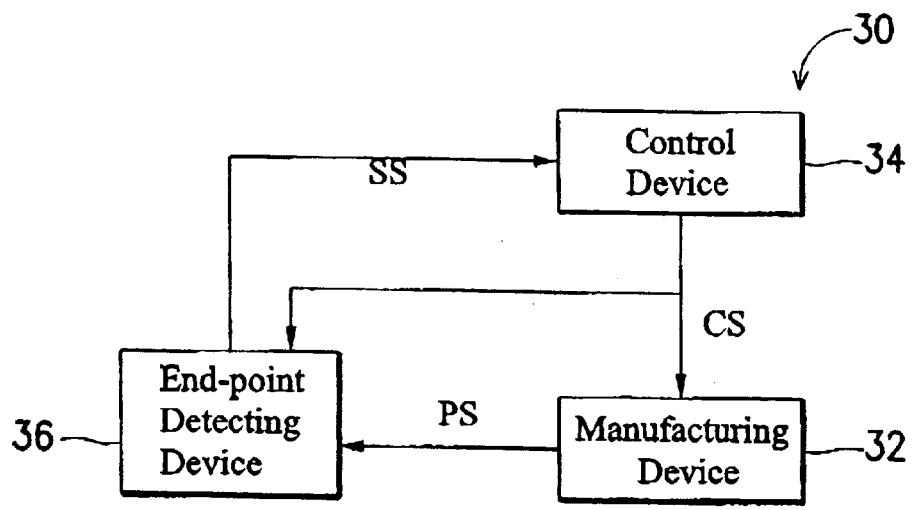
FIG. 3 represents the manufacturing apparatus of the present invention.

FIG. 3 shows the manufacturing apparatus of the present invention. The present invention provides a manufacturing system 30 comprising a manufacturing device 32, a control device 34, and an end-point detecting device 36. The manufacturing device 32 implements a manufacturing process and produces process signals PS. The control device 34 provides control signals CS to the manufacturing device 32 for controlling the manufacturing process. The end-point detecting device 36 monitors and filters the process signals to generate synchronization signals synchronized with the control signals, and determines an end-point according to a judging standard. The judging standard defines the feature of the synchronization signals corresponding to a specific state of the process.

In the spirit of the end-point detecting method of the present invention, apart from the monitoring of the process signals PS generated from the manufacturing device 32, the control signals CS also play a role as a reference for determining an end-point.

With respect to the frequency response, the process signals must comprise a synchronization signal synchronized with the control signals CS. As an example, the control signals CS, the impulse response of the manufacturing device 32 and the synchronization signals are denoted as $x(t)$, $h(t)$ and $y(t)$ respectively, and their relationship is represented with the following equation:

$$y(t) = h(t) \text{ conv. } x(t) \quad (1)$$

where "conv." represents the operation of convolution. If represented with the frequency domain the equation (1) becomes:

$$Y(f) = H(f) * X(f) \quad (2)$$

The end-point detecting method of the present invention includes the monitoring of the synchronization signals $y(t)$ in order to find the impulse response $h(t)$ of the manufacturing device 32. Once $h(t)$ is determined, the state of the manufacturing device 32 is known, and the decision of the end-point can depend upon this state. For example, it the control signals $x(t)$ are emitted through a fixed frequency $\omega 0$, the frequency of the synchronization signals $y(t)$ must be equal to $\omega 0$ or an integer multiplication of $\omega 0$. The synchronization signals $y(t)$ can be extracted or emphasized from the observed output signals, namely the process signals PS, such that the state of the manufacturing device 32 can be determined by the synchronization signals $y(t)$ themselves or by the correlation between the synchronization signals $y(t)$ and the control signals $x(t)$, so as to find the end-point of the process. In other words, the noisy portions of the process signals PS inharmonic and asynchronous to the En control signals $x(t)$ are filtered out, therefore, the determination of the process end-point won't be affected by the noises.

It is possible that the control signals $x(t)$ may be slightly affected by external noises due to power surging. Misjudgment also can be excluded by comparing the synchronization signals $y(t)$ with control signals $x(t)$. As mentioned above, the impulse frequency response $H(f)$ is determined by $Y(f)/X(f)$. If $x(t)$ is slightly changed, $y(t)$ is also changed as a result, and $Y(f)/X(f)$ will remain constant if the state of the manufacturing device 32 does not shift. Thus, the comparison between the synchronization signals $y(t)$ and the control signals $x(t)$, denoted as $Y(f)/X(f)$, is a good indicator for determining an end point.

Figure 4:
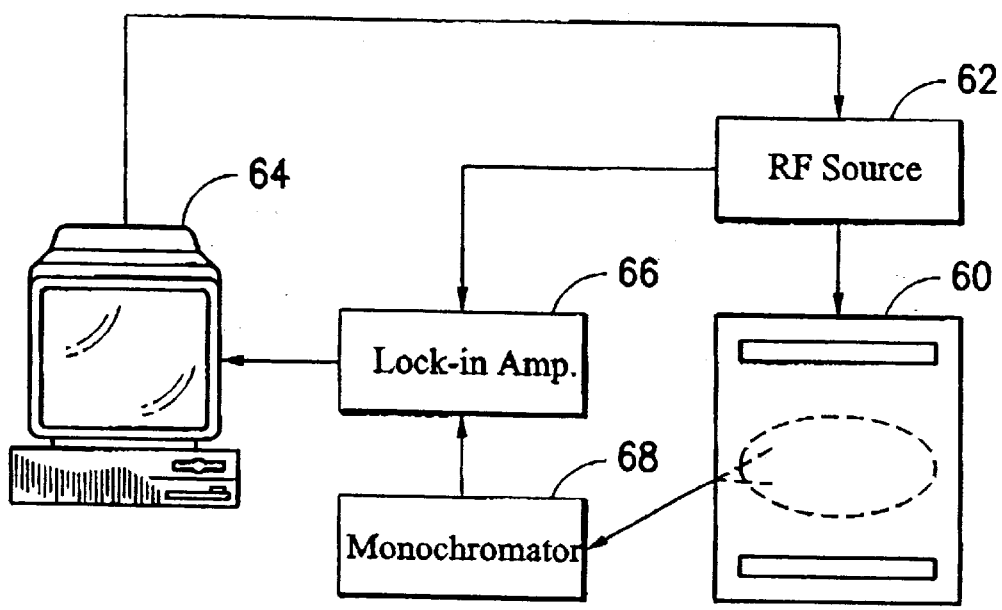
FIG. 4 represents a plasma etching system of the present invention.

For the purpose of illustrating the manufacturing apparatus 30 clearly, a plasma etching system, as shown in FIG. 4, is used here as a manufacturing apparatus for describing the end-point detecting method of the present invention. A vacuum chamber 60 is used as a manufacturing device, and an RF power source 62, as a control device, provides a RF power of 13.56 MHz for performing a plasma etching process inside the vacuum chamber 60. A general computer 64, a lock-in amplifier 66 and a monochromator 68 together are used as an end-point detecting device. The monochromator 68 transforms the light signals emitted from the vacuum chamber 60 to electrical signals. The lock-in amplifier 66 acts as a filter to filter-out portion of the electrical signals not synchronous to the RF power. For example, only the portion with frequency of 13.56 MHz in the electrical signals can pass the lock-in amplifier 66. The general computer 64 monitors the output of the lock-in amplifier 66. When the output of the lock-in amplifier 66 doesn't meet criterion built into the general computer 64, the general computer 64 determines the instant as a process end-point and changes the parameters of the RP source 62.

Figure 5:
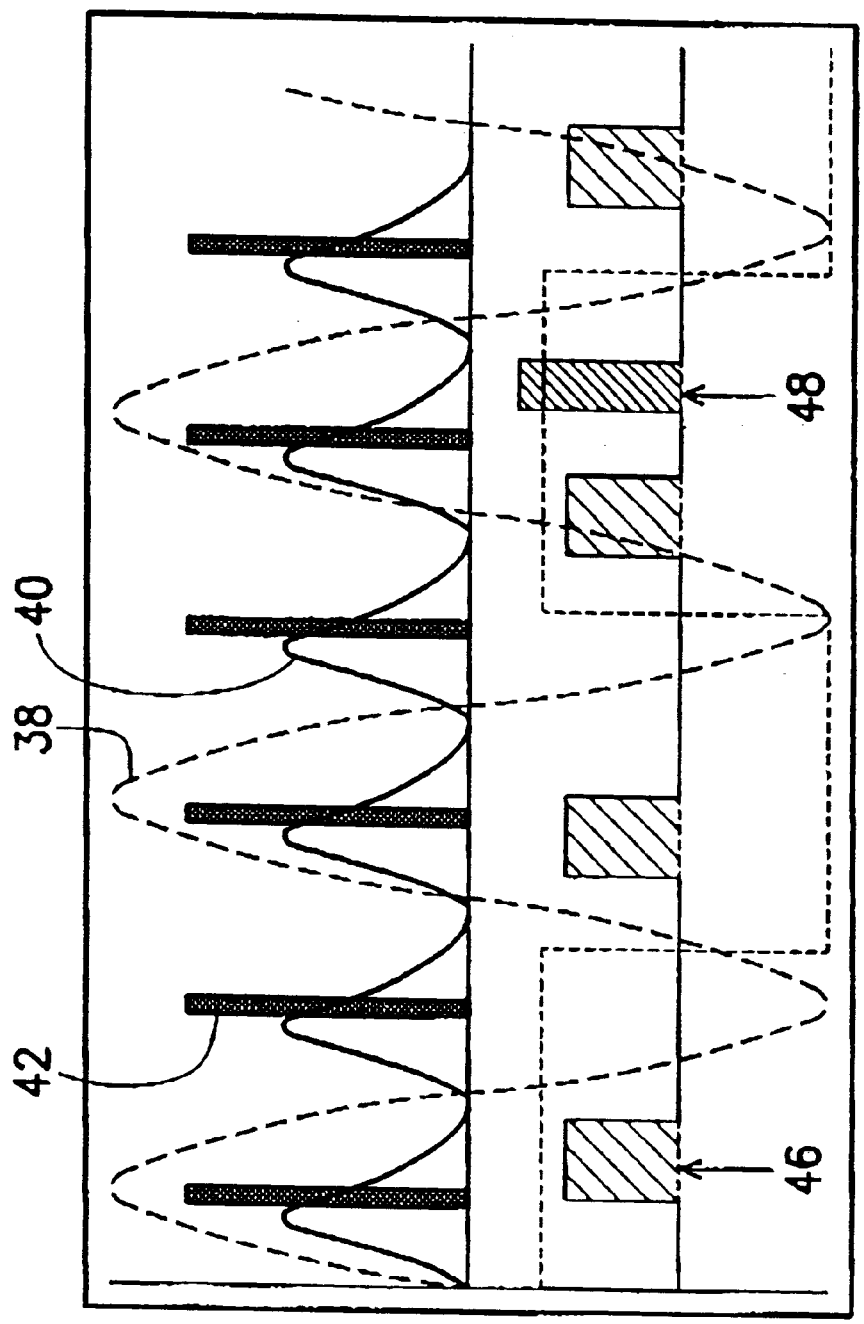
FIG. 5 represents a schematic diagram of the end-point detecting method of the present invention.

FIG. 5 is a schematic diagram of the end-point detecting method of the present invention. The dotted line of the sine wave represents the voltage change of the RP power supply 38, with the frequency of about 13.56 MHz. The plasma concentration 40 and the light intensity signal 42 in the vacuum chamber are approximately proportional to the absolute voltage value of the RF power supply 38. Therefore, as the power supply changes, the plasma concentration and the light intensity will synchronously change in proportion, both having the frequencies of about 13.56*2 MHz. Naturally, there will be other power sources with different frequencies, so there will be fixed frequency noises 46, as shown in FIG. 4. Along with the random noises 48 mixed in, both will have effects on the light intensity signal. However, because of the different frequencies, the effect of both the fixed frequency noises 46 and the random noises 48 on the light intensity signal will be filtered, and thus not affect the judgment of the end-point.

The reference frequency does not have to be 13.56 Mhz, the RF source frequency. Depending on the design of the discharge source, in some cases an external source other than RF can be used as the frequency reference. Under this configuration, the synchronous signals for end-point judgment are synchronized with the external reference frequency.

Comparing the conventional time-average method with the present invention, it is noted that in the conventional time-average method, the effect of noise cannot be removed. Instead, the effect of noise is just diluted by averaging of time (or number of sampling points). On the other hand, in the present invention, if the noise is not synchronous or harmonic with the process signals, it is filtered out of the output signals by the lock-in amplifier. Thus, this invention bypasses the problems of RF instability to obtain a better end-point determination performance.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Similarly, any process steps described herein may be interchangeable with other steps in order to achieve the same result. Therefore, the scope of the appended claims should be accorded the broadest interpretation so as to encompass all such modifications and similar arrangements, which is defined by the following claims and their equivalents.

What is claimed is:

1. A frequency modulated end-point detecting method, suitable for finding an end-point of a manufacturing process by a manufacturing device, comprising:

sending control signals to the manufacturing device for performing the manufacturing process, wherein process signals are generated during in the manufacturing process;

filtering the process signals to obtain synchronization signals synchronized with the control signals;

providing a judging standard according to the synchronization signals corresponding to a specific state of the process; and continuously monitoring the synchronization signals, and determining a process end-point when the synchronization signals do not meet the judging standard, wherein the judging standard is defined according to the correlation between the synchronization signals and control signals corresponding to a specific state of the process, and the end-point is determined by monitoring the synchronization signals and control signals.

2. The detecting method as claimed in claim 1, wherein the control signals are sent with by a major frequency w0, and the synchronization signals have base frequencies equal to w0 or an integer multiplication of w0.

3. The detecting method as claimed in claim 1, wherein the manufacturing device is a plasma chamber.

4. The detecting method as claimed in claim 1, wherein the manufacturing process is a plasma etching manufacturing process.

5. The detecting method as claimed in claim 4, wherein the control signals are wave signals generated from by a plasma power, and the plasma power is emitted through a first frequency.

6. The detecting method as claimed in claim 5, wherein the first frequency is 13.56 MHz.

7. The detecting method as claimed in claim 4, wherein the manufacturing device is a vacuum chamber, and the process signals are light intensity signals generated by the discharge of electrons of a plasma of the plasma manufacturing process in the vacuum chamber.

8. A manufacturing system, comprises:

a control device for providing control signals;

a manufacturing device for performing a manufacturing process controlled by the control signals and generating process signals; and an end-point detecting device for monitoring and filtering the process signals to generate synchronization signals synchronized with the control signals, and determining an end-point according to a judging standard defining the value of the synchronization signals corresponding to a specific state of the process, wherein the judging standard is defined according to the correlation between the synchronization signals and the control signals corresponding to a specific state of the process, and the end-point is determined by comparing the synchronization signals with the control signals.

9. The manufacturing system as claimed in claim 8, wherein the control signals comprise a major frequency w0, and the synchronization signals have base frequencies equal to w0 or an integer multiplication of w0.

10. The manufacturing system as claimed in claim 8, wherein the end-point detecting device has a filter for filtering off portion of the process signals which are not synchronized with the control signals.

11. The manufacturing system as claimed in claim 8, wherein the filter is a lock-in-amplifier.

12. The manufacturing system as claimed in claim 8, wherein the manufacturing process is a plasma etching manufacturing process.

13. The manufacturing system as claimed in 12, wherein the control signals are wave signals generated by the plasma power provided by the control device, and the plasma power is emitted through a major frequency.

14. The manufacturing system as claimed in claim 13, wherein the major frequency is 13.56 MHz.

15. The manufacturing system as claimed in claim 13, wherein the synchronization signals have base frequencies equal to the major frequency or integer multiplications of the major frequency.

16. The manufacturing system as claimed in claim 8, wherein the manufacturing device comprises a vacuum chamber, and the process signals are the light intensity generated by discharge of electrons in the vacuum chamber during the plasma manufacturing process.

* * * * *